United States Patent [19]
Cheng et al.

[11] Patent Number: 5,902,452
[45] Date of Patent: May 11, 1999

[54] METHOD FOR ETCHING SILICON SURFACE

[75] Inventors: M. C. Cheng; J. S. Liu, both of Taipei; C. C. Chang, Chu-Ton, all of Taiwan

[73] Assignee: Taiwan Semiconductor Manufacturing Co., Ltd., Hsin-chu, Taiwan

[21] Appl. No.: 08/816,275

[22] Filed: Mar. 13, 1997

[51] Int. Cl.$^6$ ...................................................... B44C 1/22
[52] U.S. Cl. ........................ 156/657; 156/653; 156/656; 156/643; 156/662; 156/661.1
[58] Field of Search ..................... 156/656, 643, 156/662, 657, 661.1, 653; 216/2

[56] References Cited

U.S. PATENT DOCUMENTS

| | | |
|---|---|---|
| 5,106,432 | 4/1992 | Matsumoto et al. .................... 148/33.2 |
| 5,128,280 | 7/1992 | Matsumoto et al. .................... 437/203 |
| 5,346,586 | 9/1994 | Keller .................................... 156/656 |
| 5,733,711 | 3/1998 | Juengling .............................. 430/312 |

*Primary Examiner*—James C. Housel
*Assistant Examiner*—Jennifer Shaver
*Attorney, Agent, or Firm*—Tung & Associates

[57] ABSTRACT

The present invention discloses a method for etching a silicon surface or forming alignment marks in a silicon substrate by first coating the substrate with an oxide layer, then depositing and patterning a photoresist layer on top of the oxide layer and forming the alignment marks by a dry etching process utilizing fluorine/oxygen etchant chemistry for the simultaneous etching of the two layers in a single process wherein the oxide layer prevents the contamination of the silicon wafer by any silicon particles formed.

20 Claims, 2 Drawing Sheets

METHOD FOR ETCHING SILICON SURFACE

FIELD OF THE INVENTION

The present invention generally relates to a method for etching a silicon surface and more particularly, relates to a method for etching a silicon surface for alignment marks by a single dry etching method in which silicon oxide and silicon are simultaneously removed.

BACKGROUND OF THE INVENTION

In the fabrication of integrated circuit chips from a silicon wafer, dimensions must be controlled with extreme accuracy during the masking (or photo imaging) step in order to ensure that circuits are laid down within allowable specifications. An important tool for such dimensional control is the alignment technique or by using alignment marks. The alignment technique refers to the ability of printing images of a mask over other images that were printed in previously masking steps with high precision. The overlay errors which are defined as errors in the placement of one pattern in relation to another must be tightly controlled such that it is within an allowable range. The accuracy of pattern placement on a reticle (in a masking machine) is therefore crucial to the superposition of successive masks during chip fabrication. In order to ensure such accuracy, each mask contains specifically designed and positioned alignment marks, or registration marks which allow the alignment of a subsequent mask. During the fabrication of IC chips, it is critical to align each subsequent layers to a previous layer with extreme accuracy in order to ensure circuit continuity.

The alignment of a mask to a wafer is generally performed in a wafer stepper tool. For instance, a frequently used equipment is an ASM lithography stepper. The function of the stepper is to transfer a desired pattern from a reticle onto a photoresist layer formed on the wafer. Typically, the reticle contains a 5x magnified version of the pattern to be reproduced. The photoresist layer is generally a transparent photosensitive material that is coated on top of the wafer. After the wafer is loaded into the stepper machine, the alignment marks on the wafer are used as reference points for adjusting the position of the reticle over the wafer such that a precise alignment of the reticle to the previous layer formed on the wafer can be achieved.

Alignment is typically performed in an automated manner by sensing a light, i.e., a laser beam, detracted from alignment marks on the wafer. A typical wafer 10 having a locating notch 12 and alignment marks 14 is shown in FIG. 1. Since precision of alignment depends on the contrast of an optical signal obtained from an alignment mark, the mark should ideally be provided with a sufficiently large step, and consequently producing a large variance in its refractive index for producing a sufficiently large contrast. FIG. 2 is an illustration of how the measurement of an alignment mark is conducted on the surface of a silicon wafer. It is seen that an optical beam 20, or laser beam, is moved across the surface 22 of the wafer 10 in a perpendicular direction with the surface. A typical alignment mark 24, as shown in FIG. 2, is formed by first etching a trench in the silicon surface 22 and then filling it with silicon oxide 16. A photomask (not shown) such as one for the active area mask can then be directly aligned to the mark 24. An alignment signal 28 can be measured having a sufficient magnitude 30 such that a proper alignment can be accurately made. The registration of a new mask to a previously defined pattern on the wafer is therefore accomplished on the chip by scanning the optical beam 20 across the alignment mark 24 etched in the substrate 10 and by detecting the secondary electrons 26 and the backscattered electrons 32.

The alignment mark 24 is normally formed by etching a predetermined depth 18 into the surface 22 of silicon wafer 10. The step 18 etched forms a distinct step height in the wafer surface which is then used as an alignment mark. The depth of the alignment mark thus formed can be chosen such that it is a multiple of the wavelength of the optical light (or laser light) used in the stepper machine for performing alignment. For instance, in a typical alignment mark forming process, an alignment mark photoresist layer 34 is first deposited onto the surface of a silicon wafer. The thickness of the alignment mark photoresist layer can be suitably chosen from a range between about 8,000 Å and about 15,000 Å. After an image is formed in the photoresist layer 34, a descum procedure is necessary to remove any residual photoresist left on the surface of the wafer. The descum procedure can be carried out in an oxygen plasma process at 100° C. and 12 Torr pressure, RF power of 300 W, an $O_2$ flow rate of 8000 Sccm for an etch time of 15 seconds. The wafer is then sent through an oxide wet dip process followed by a hard bake for removal of all moisture. The wafer is then dry etched to form the alignment marks followed by a standard photoresist strip. A typical flow chart for the process is shown in FIG. 3.

In the conventional alignment mark forming process, a thin layer, i.e., of approximately 350 Å of thermal oxide is first grown on the silicon substrate by a furnace process prior to the deposition of photoresist. The oxide layer serves two functions. First, it prevents silicon particles produced during a dry etching process from contaminating the wafer surface. Secondly, the growth of the oxide layer decreases the oxygen content (i.e., in $SiO_2$) on the wafer surface which frequently contain impurities that have higher concentration of oxygen. As a result, the growth of the oxide layer on the wafer surface reduces surface defects on the wafer. The conventional process for forming alignment marks therefore requires an additional step of oxide removal by a wet dip process with acid. As a result, a hard bake process must be subsequently conducted to remove moisture. The conventional process for forming alignment marks therefore requires the additional processing steps of descuming, the oxide wet dip, and the hard bake process which increases the fabrication cost of a wafer.

It is therefore an object of the present invention to provide a method for forming alignment marks in a silicon wafer that does not have the drawbacks and shortcomings of the conventional methods.

It is another object of the present invention to provide a method for forming alignment marks in a silicon wafer that has simplified processing steps than the conventional methods.

It is a further object of the present invention to provide a method for forming alignment marks in a silicon wafer by first forming an oxide layer to prevent the contamination of silicon particles and then removing the oxide layer and partially the silicon layer in a single dry etching process.

It is yet another object of the present invention to provide a method for forming alignment marks in a silicon wafer that is capable of producing marks of improved detection signal when measured in a stepper machine.

It is still another object of the present invention to provide a method for forming alignment marks in a silicon wafer including the step of etching through an oxide layer and into the silicon surface by a single plasma dry etching process utilizing an etchant chemistry of fluorine and oxygen.

It is another further object of the present invention to provide a method for forming alignment marks in a silicon wafer including the step of etching through an oxide layer and into a silicon layer by using a mixture of $CF_4$ and $O_2$ as the etchant gas in a dry etching process.

SUMMARY OF THE INVENTION

In accordance with the present invention, a method for forming alignment marks in a silicon substrate by first forming an oxide layer on the silicon surface for preventing contamination of silicon particles produced and then etching through the oxide layer and into the silicon layer s in a single dry etching process by utilizing etchant chemistry of fluorine and oxygen is provided.

In one embodiment, a method for etching silicon is provided which includes the steps of first providing a silicon surface, then forming an oxide layer on the silicon surface, then depositing and patterning a photoresist layer on the oxide layer, and then removing the oxide layer and a predetermined thickness of the underlying silicon in a dry etching process.

In another embodiment, a method for etching a silicon substrate is provided which can be carried out by the steps of first providing a silicon substrate that has an oxide layer formed on top, then depositing a photoresist layer on the oxide layer, then patterning the photoresist layer, and then dry etching the oxide layer and a predetermined thickness of the underlying silicon substrate, then removing the photoresist layer.

In yet another embodiment, a method for forming an alignment mark in a silicon substrate is provided which consists of the steps of first providing a silicon substrate, then forming an oxide layer on the silicon substrate, then depositing a photoresist layer and patterning the alignment mark in the photoresist layer, then etching through the oxide layer into a predetermined thickness of the silicon substrate by an etchant gas capable of etching both materials at substantially the same rate, and then removing the photoresist layer, whereby the oxide layer prevents the formation of silicon particles and the contamination of the wafer.

BRIEF DESCRIPTION OF THE DRAWINGS

These and other objects, features and advantages of the present invention will become apparent from the following detailed description and the appended drawings in which.

DETAILED DESCRIPTION OF THE PREFERRED EMBODIMENT

The present invention provides a method for etching a silicon surface or forming alignment marks in a silicon substrate by first forming an oxide layer on top of the silicon and then depositing and patterning a photoresist layer for the alignment marks, followed by a dry etching process utilizing fluorine and oxygen chemistry to remove the oxide layer and a predetermined depth of the silicon layer in a single etch process.

According to the present invention method, instead of etching directly a silicon surface on a substrate by a zero layer etch process, an initial oxide (or start oxide) layer is first formed in a furnace to protect the substrate surface from contamination by silicon particles produced during the silicon etch. The initial oxide layer can be formed in a dry oxidation, or atmospheric oxidation, process by exposing the wafer to dry oxygen at an elevated temperature such that silicon on or near the surface is converted into silicon dioxide. The dry oxidation temperature utilized is in the range between about 750° C. and about 100° C. The process can be conducted in a resistance heated furnace or in a rapid thermal processing (RTP) chamber. During the process, dry oxygen can be mixed with an inert gas carrier such as nitrogen and then passed over the silicon wafer maintained at an elevated temperature. The exposure time should be sufficient to dry oxidize the silicon surface, for example, in the range between about 1 hour and about 10 hours. A suitable flow rate for the dry oxygen into the furnace is at least 3000 sccm. The oxidation of the wafer surface can also be carried out in a wet oxidation process during which oxygen is bubbled through a water bath maintained at a temperature of at least about 75° C., the oxygen/water vapor mixture is then passed over a silicon wafer maintained at an elevated temperature of at least about 750° C.

The formation of an oxide layer on top of the silicon substrate provides a further advantage of being able to control the content of impurities on the surface of the substrate. Since the surface of a silicon substrate often contains oxygen-rich impurities, these impurities diffuse into the oxide layer when the initial oxide layer is formed on the wafer surface. When the initial oxide layer is subsequently removed after the formation of the alignment marks, the impurity content on the wafer surface is reduced and consequently, a cleaner wafer surface is obtained.

Figure 1:
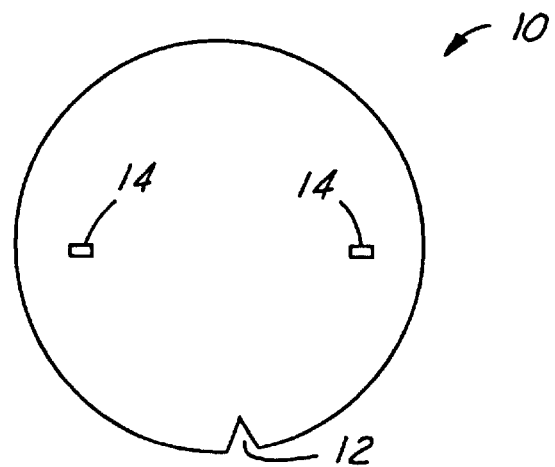
FIG. 1 is an illustration of a wafer having alignment marks formed thereon.
Figure 2A:
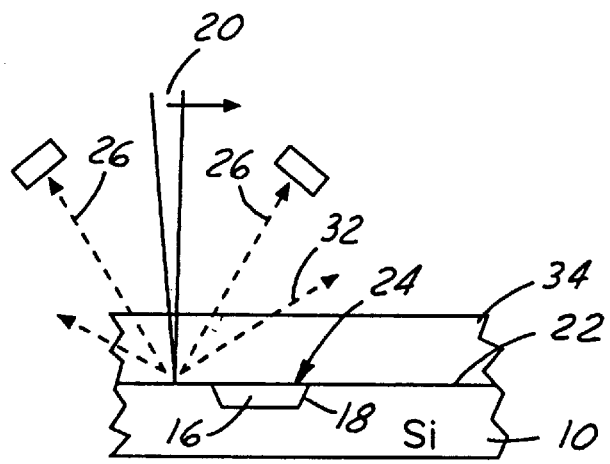
FIGS. 2A and 2B are illustrations of a stepper alignment process utilizing an optical beam.
Figure 2B:
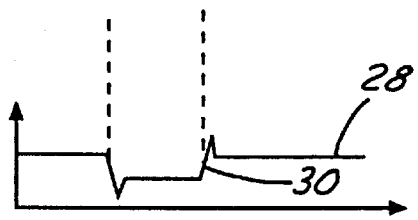
Figure 3:
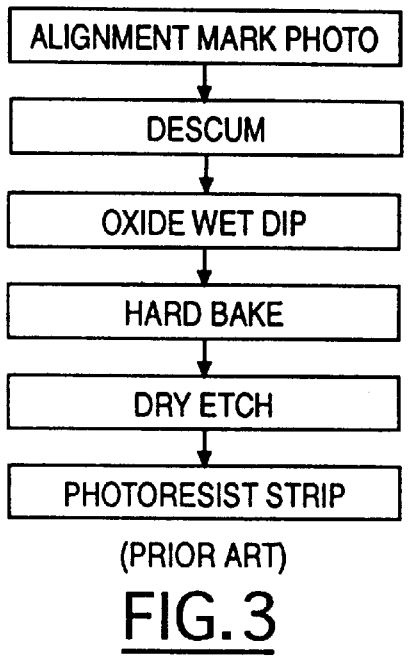
FIG. 3 is a flow chart of a conventional process for forming alignment marks including the separate steps for removing the oxide layer and the silicon layer.
Figure 4:
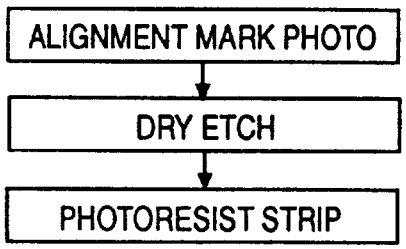
FIG. 4 is a flow chart illustrating the present invention process for forming alignment marks utilizing a single dry etching process.
Figure 5:
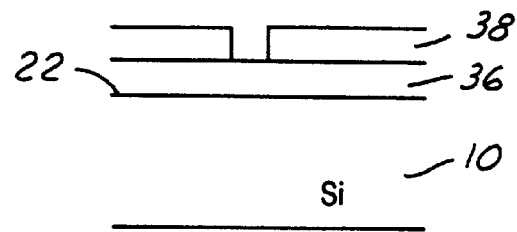
FIG. 5 is an enlarged, cross-sectional view of the present invention wafer having a photoresist layer deposited and patterned on top.

Referring now to FIG. 4, wherein a flow chart of the present invention novel method for forming alignment marks is shown. The present inventive novel process can be carried out by first applying a photoresist layer (preferably transparent) onto an oxide layer that is previously formed on the silicon substrate. After patterning with a desirable mask, as shown in FIG. 4, the wafer is processed in a dry etching process. The thickness of the initial oxide layer 36 (FIGS. 5 and 6) is between about 200 Å and about 600 Å, and preferably between about 300 Å and about 400 Å. A transparent photoresist layer 38 of approximately 12000 Å thick can be advantageously used for patterning the alignment marks.

Figure 6:
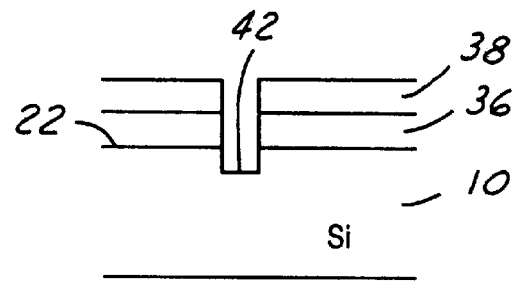
FIG. 6 is an enlarged, cross-sectional view of the present invention wafer shown in FIG. 5 after a dry etching process is conducted.

A dry etching process is then conducted on the silicon wafer 10 that has the oxide layer 36 and the photoresist layer 38 on top. This is shown in FIG. 6. In a search for suitable etchant gas system for use in the present invention method, various etchant gas systems were tried out. For instance, the etchant gas of carbon tetrolfluoride ($CF_4$) was first tried out producing an etch rate of 791 Å/min for silicon, and 976 Å/min for oxide. Even though the etch rates for silicon and for oxide are close, the rates were too low for use in a fabrication process to maintain a reasonable yield. The etchant gas of chlorine ($Cl_2$) was also tried out which produced an etch rate of 1586 Å/min for silicon and an etch rate of 20.5 Å/min for oxide. The large discrepancy between the two etch rates renders chlorine unsuitable for the present invention etching process. The etchant gas of hydrogen bromide (HBr) was also tried out which produced an etch rate of 0 Å/min for silicon and an etch rate of 8 Å/min for oxide. Hydrogen bromide therefore could not be considered as a feasible etchant gas for the present invention etching process. Another etchant gas that was tried out was sulfur tetrafluoride ($SF_6$) which produced an etch rate of 12,298 Å/min for silicon and an etch rate of 221 Å/min for oxide. The large difference between the two etch rates renders $SF_6$ not feasible for the present invention etch process.

Figure 7:
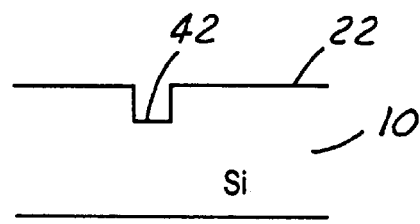
FIG. 7 is an enlarged, cross-sectional view of the present invention wafer shown in FIG. 6 after the alignment marks are formed and the photoresist and the oxide layers removed.

A most suitable etchant gas system was accidentally discovered by mixing carbon tetrafluoride ($CF_4$) and oxygen ($O_2$). The flow rates used for $CF_4$ is between about 50 sccm and about 110 sccm and preferably between about 70 sccm and about 90 sccm. The flow rate used for $O_2$ was between about 10 sccm and about 16 sccm, and preferably at about 13 sccm. The chamber pressure used was 750 m Torr for an etch time of between about 20 and about 60 seconds, and preferably at about 35 seconds. The RF power used for generating the plasma is about 275 watts. The etch rate obtained for silicon was 2091 Å/min and the etch rate obtained for oxide was 1200 Å/min. Both etch rates are sufficiently high, and yet sufficiently close such that the etchant gas system containing both $CF_4$ and $O_2$ can be advantageously used for the present invention novel etching method. An etch depth obtained in the silicon wafer after the present invention dry etching process is 1220 Å, which is well within the specification of 1200±200 Å for the stepper alignment. The alignment mark 42 obtained, as shown in FIG. 6, is measured for its signal strength after the oxide layer 36 is removed. The strength measured was 82 which is substantially higher than the control of 69 indicating that a satisfactory alignment process can be carried out. FIG. 7 shows the alignment mark 42 after the oxide layers 36 and the photoresist layers 38 are removed.

While the present invention has been described in an illustrative manner, it should be understood that the terminology used is intended to be in a nature of words of description rather than of limitation.

Furthermore, while the present invention has been described in terms of a preferred embodiment, it is to be appreciated that those skilled in the art will readily apply these teachings to other possible variations of the inventions.

The embodiment of the invention in which an exclusive property or privilege is claimed are defined as follows:

1. A method for forming alignment marks in a silicon substrate, comprising the steps of:
    forming an oxide layer on a surface of said silicon substrate,
    depositing and patterning a photoresist layer on said oxide layer, and
    removing the oxide layer and a predetermined thickness of the underlying silicon in a single dry etching process using a mixture of $CF_4$ and $O_2$ as etchant gases.

2. A method according to claim 1, wherein said oxide layer is formed in a thermal process having a thickness of not more than 1000 Å.

3. A method according to claim 1 further comprising the step of removing said photoresist layer after said dry etching step.

4. A method according to claim 1, wherein said dry etching step is a plasma etching process.

5. A method according to claim 1, wherein said $CF_4$ gas is supplied into a processing chamber at a flow rate of between about 50 sccm and 110 sccm, and said $O_2$ gas is simultaneously supplied into said chamber at a flow rate of between about 10 sccm and 16 sccm.

6. A method according to claim 1, wherein said $CF_4$ gas is supplied into a processing chamber at a flow rate of between about 70 sccm and 90 sccm, and said $O_2$ gas is simultaneously supplied into said chamber at a flow rate of about 13 sccm.

7. A method according to claim 5, wherein said dry etching step includes creating a pressure within said chamber of approximately 750 m Torr, and continuing the etching process within said chamber for approximately between 20 and 60 seconds.

8. A method according to claim 1, wherein said predetermined thickness of the silicon layer removed is at least 500 Å.

9. A method according to claim 1, wherein said dry etching step includes supplying $CF_4$ and $O_2$ into a chamber at respective flow rates that cause the silicon oxide and silicon to be etched at substantially the same rates.

10. A method for etching an alignment mark in a silicon substrate comprising the steps of:
    providing a silicon substrate having an oxide layer formed on top,
    depositing a photoresist layer on the oxide layer,
    patterning said photoresist layer,
    simultaneously dry etching said oxide layer and a predetermined thickness of the underlying silicon substrate in a single process step using a mixture of $CF_4$ and $O_2$ as etchant gases for etching said oxide layer and said silicon substrate at substantially the same rate, and
    removing said photoresist layer.

11. A method according to claim 10, wherein said $CF_4$ gas is supplied into a processing chamber at a flow rate of between about 50 sccm and 110 sccm, and said $O_2$ gas is simultaneously supplied into said chamber at a flow rate of between about 10 sccm and 16 sccm.

12. A method according to claim 11, wherein said alignment mark formed has a depth of at least 500 Å.

13. A method according to claim 10, wherein said oxide layer is formed on the silicon substrate by a thermal oxidation method.

14. A method according to claim 10, wherein said $CF_4$ gas is supplied into a processing chamber at a flow rate of between about 70 sccm and 90 sccm, and said $O_2$ gas is simultaneously supplied into said chamber at a flow rate of about 13 sccm.

15. A method according to claim 10, wherein said dry etching step includes creating a pressure within said chamber of approximately 750 m Torr, and continuing the etching process within said chamber for approximately between 20 and 60 seconds.

16. A method according to claim 10, wherein said dry etching step includes supplying said $CF_4$ and $O_2$ gases into a chamber at respective flow rates that cause the silicon oxide and silicon to be etched at substantially the same rates.

17. A method for forming an alignment mark in a silicon substrate comprising the steps of:
    providing a silicon substrate,
    forming an oxide layer on said silicon substrate,
    depositing a photoresist layer and patterning said alignment mark in said photoresist layer, etching through said oxide layer and into a predetermined thickness of said silicon substrate by an etchant gas capable of etching both materials at substantially the same etch rate, wherein said etchant gas includes a mixture of $CF_4$ and $O_2$ gases, and removing said photoresist layer, whereby said oxide layer prevents the contamination of the silicon substrate.

18. A method according to claim 17, wherein said oxide layer is formed by a thermal process to a thickness of less than 1000 Å.

19. A method according to claim 17, wherein said etching step includes supplying said $CF_4$ gas into a processing chamber at a flow rate of between about 50 sccm and 110 sccm, and simultaneously supplying said $O_2$ gas into said chamber at a flow rate of between about 10 sccm and 16 sccm.

20. A method according to claim 17, wherein said etching step includes supplying said $CF_4$ gas into a processing chamber at a flow rate of between about 70 sccm and 90 sccm, and simultaneously supplying said $O_2$ gas into said chamber at a flow rate of about 13 sccm.

* * * * *